United States Patent [19]

Shu et al.

[11] 4,318,976
[45] Mar. 9, 1982

[54] HIGH GEL RIGIDITY, NEGATIVE ELECTRON BEAM RESISTS

[75] Inventors: Jing S. Shu, Plano; Wei Lee, Richardson; Gilbert L. Varnell, Dallas, all of Tex.; John L. Bartelt, Westlake Village, Calif.

[73] Assignee: Texas Instruments Incorporated, Dallas, Tex.

[21] Appl. No.: 200,652

[22] Filed: Oct. 27, 1980

[51] Int. Cl.³ .............................................. B05D 3/06
[52] U.S. Cl. ................................. 430/287; 204/159.2; 204/159.22; 427/43.1
[58] Field of Search ............... 427/43.1; 430/287, 286, 430/270; 204/159.2, 159.22, 159.15

[56] References Cited

U.S. PATENT DOCUMENTS

| | | | |
|---|---|---|---|
| 4,110,187 | 8/1978 | Sloan et al. | 204/159.15 |
| 4,208,211 | 6/1980 | Bowden et al. | 427/43.1 |
| 4,267,258 | 5/1981 | Yoneda et al. | 204/159.22 |

Primary Examiner—John H. Newsome
Attorney, Agent, or Firm—Melvin Sharp; James T. Comfort; Douglas A. Lashmit

[57] ABSTRACT

A negative, high energy radiation resist based on styrene-allyl methacrylate copolymers and substitutional modifications thereof, yielding a linear copolymer with highly sensitive allyl pendant groups together with a thermally stable, solvent resistant backbone. This resist exhibits improved e-beam sensitivity without the attendant problems of swelling during development and flow during heat processing.

8 Claims, No Drawings

HIGH GEL RIGIDITY, NEGATIVE ELECTRON BEAM RESISTS

BACKGROUND OF THE INVENTION

This invention relates generally to compositions and methods for forming etch resistant masks, and more particularly to negative, high energy radiation resists for semiconductor device fabrication.

A resist is an adhering layer of a material having patterned openings on a support, used as a mask for etching the support exposed by the opening in the resist. The use of light as the radiation or energy source for fabricating integrated circuits by using photoresists in the semiconductor art has been common for many years. The photoresist method of semiconductor manufacture was adequate until the advent of small geometry high-frequency devices and integrated circuits requiring the formation of patterns with line widths in the neighborhood of one micron. Although 1 micron line openings, or resolution, can be obtained from photolithography in the laboratory, such line widths are not reproducible due to diffraction problems, with a practical limit of production produced openings being in the neighborhood of 3 microns in width.

The step from the use of light to electrons as a vehicle to fabricate integrated circuits was a logical one. Theoretically, since the size of an electron is only 1/1000th the size of a quantum of light, an electron beam should produce openings with line widths 1/1000th the size of openings obtained with photo resists. However, due to electron bounce back or back-scatter from the surface supporting the resist, such small width openings are not obtainable, only 1000 Angstroms being the practical lower limit size.

In the case of electron beam technology, an electron beam is scanned across the resist itself to form the desired pattern. The electron beam is controlled by a computer which has been fed the coordinates of the pattern as previously determined by a designer. Thus, the use of the electron beam has eliminated all the time lost in preparing the reduction of photography required to form a pattern for the resist. However, due to the pattern in the electron beam resist resulting from the scan of a very narrow electron beam, the required long exposure of the resist to the electron beam is the time draw back to the production use of electron beam resists.

Obviously, then, in addition to the characteristics required of a photoresist, such as good adhesion to many materials, good etch resistance to conventional etches, solubility in desired solvents, and thermostability, an electron beam resist must react to the electron beam radiation fast enough to allow a reasonable scan time of the electron beam. In order to bring electron beam technology into the production status, resists composed of thin polymer films that are capable of producing an image of one micron or less at very high scanning speeds of the electron beam are required.

Depending on their structures, polymeric materials tend to either degrade or cross-link when exposed to high energy radiation. Polymers which tend to degrade under radiation exposure are called positive resists. The exposed portion of the polymer always shows a higher dissolution rate to a given solvent than the unexposed portion of the same material. Polymers which tend to cross-link under radiation exposure are called negative resists. The exposed area of the polymer shows a lower dissolution rate to a given solvent than unexposed areas.

The practical implementation of direct e-beam lithography thus depends heavily on the availability of electron beam resists with high electron sensitivity and submicron resolution. Besides electron scattering, the two most serious causes for loss in resolution and pattern distortion are swelling during development and flow during baking. Previous attempts to synthesize polymers containing allyl groups from other bifunctional monomers have led to significant branching and gel cross-linking during polymerization which seriously degrades the performance of the polymer as an electron resist.

A major goal in the development of electron resists is to obtain high sensitivities, i.e., to obtain useful polymeric relief images with dosages of less than about $10^{-6}$ C/cm$^2$. This is typically accomplished by using materials which incorporate vinyl, epoxy, or allyl functional groups into the resist polymer. However, polymers incorporating these e-beam sensitive groups always show significant swelling during developing. The small geometries of the high density pattern are thus distorted or collapsed.

COP, a copolymer of glycidyl methacrylate and ethyl acrylate, is widely used as a negative resist in e-beam lithography. This resist has a good sensitivity, but exhibits swelling during developing. Glycidyl groups in the COP are the main sites for the occurence of cross-linking during exposure, whereas the ethyl acrylate provides good film properties with some cross-linking probability. However, the glycidyl groups are not as sensitive as the vinyl group toward e-beam and ethyl acrylate units are so flexible in the copolymers, the COP bears low glass transition temperature which causes the quick diffusion of the developer into network and swelling during developing, and also causes polymer flow of the fine lines during post baking.

Polystyrene was one of the first negative e-beam resists used in lithography. Although this material exhibits excellent film properties, high resolution, and is readily available, it's slow response to e-beam exposure, about $50 \times 10^{-6}$ coulombs/cm$^2$, makes it an unpractical working resist.

Butadiene-containing polymers are also known to be e-beam sensitive materials. Their high sensitivity is believed to be due to the vinyl groups of butadiene units, which protrude from the polymer backbone. Swelling and thermal stability, however, are major problems encountered in using them as e-beam negative resists. Although styrene monomer can be incorporated into polymers to improve these properties, the swelling phenomenon is still a problem.

Poly(diallyl phthalate), on the other hand, contains benzene rings along the polymer chains. These aromatic rings are expected to give high glass transition temperature and to possess high thermal flow resistance, but the equal reactivity of two allyl groups on the same monomer tend to enhance the cross-linking reactions of the polymer during polymerization. Low molecular weight, highly branched polymers are always obtained before cross-linking prevailed, thus, these polymers would have a low speed and would show swelling during developing.

It is, therefore, an object of this invention to provide a method of forming an electron beam resist with better resolution and narrower width openings than is presently possible.

Another object of this invention is to provide a method of forming an electron beam resist that has the desirable characteristics of good polymer film properties and adhesion on many substrates, fast scanning rate, good processibility, thermal stability and dry etch capability.

SUMMARY OF THE INVENTION

Accordingly, the present invention includes the use of a group of copolymers that cross-link, as polymeric resists, under high energy irradiation. A homogenous solution comprising a copolymer of styrene and an allyl or crotyl-containing monomer of either a methacrylic or an acrylic structure and a solvent is applied to a substrate and allowed to dry into a thin film. An electron beam is then caused to scan over the polymeric film in a predetermined pattern. The scanned area of the film cross-links and becomes insoluble in certain solvents. The pattern generation on the resist is completed by washing away the unexposed area with a suitable developer which is unable to attack or dissolve the exposed or cross-linked area.

The novel features believed characteristic of this invention are set forth in the appended claims. The invention itself, however, as well as other objects and advantages thereof, may be best understood by reference to the following detailed description.

DETAILED DESCRIPTION OF THE INVENTION

The materials used in the present invention are a series of copolymers with two basic monomeric units.

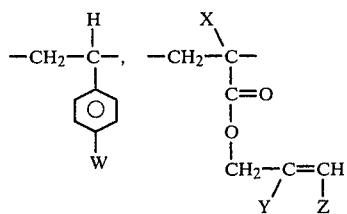

The first monomeric unit is styrene (where $W=H$) or its substituted derivatives in which W can be F, Cl, Br, I, $NO_2$, CN, $OCH_3$, and the like. The second monomeric unit is a methacrylic or an acrylic type structure in which X can be H, $CH_3$ or Cl; Y can be either H or $CH_3$; and Z can be H or $CH_3$.

The aromatic ring pendant of the first type of monomeric unit is so bulky that it sterically hinders the motion of the polymer segments and hence imparts high chain rigidity and high thermal stability to the polymers, thus enhancing the distortion resistance of a fine geometry pattern during post-baking. This aromatic ring also acts as the energy sink which accomodates significant amounts of energy. During electron beam irradiation, the energy of the back-scattered electrons can partially transfer to the ring sink, so that the extent of cross-linking of the unexposed area proximity to scanned portion noticeably decreases. This decrement allows the resists to have narrow spacing between two geometries.

The thermal stability and thus the distortion resistance of fine line geometries can be enhanced by using the styrene derivatives. In addition, most of these derivatives are more sensitive to electron beam irradiation than the styrene unit itself. For example, poly(4-cyanostyrene) has shown a glass transition temperature of 180° C. (compared to 100° C. of polystyrene) and it has a resolution capability of 1.0 micron at about $32 \times 10^{-6}$ $C/cm^2$ at 70% film thickness remaining. Similar results have also been observed to poly(4-chlorostyrene) and poly (4-iodostyrene) with sensitivities of 3.2 and $3.0 \times 10^{-6}$ $C/cm^2$, respectively, at 80% thickness remaining.

The high sensitivity of resists in the present invention to high energy radiation is mainly attributed to the presence of the group of second monomers described above. This group of monomers is bifunctional, i.e., they contain an acryloyl, methacryloyl or chloracryloyl double bond and an allyl or crotyl double bond. Although both functional groups can be expected to engage in polymerization, the acryloyl type double bond is much more reactive than the allyl type double bond. For example, in the free radical polymerization of allyl methacrylate, the methacryloyl double bond polymerizes predominately and leaves the allyl group practically unreacted when the conversion is 50% or less. This awkwardness of the allylic double bond in the polymerization is further enhanced in the free radical copolymerization of styrenes and allylic type acrylate, methacrylate or chloroacrylate. These unreacted, unsaturated allylic or crotyl groups protruding from the polymer chain thus provide the cross-linking sites for the polymer under high energy irradiation.

In general, the polymer used in the present invention is prepared by mixing a styrene type monomer and a bifunctional type monomer, as described above, in a ratio in the range between 4:1 and 1:4, and a free radical initiator, such as azobis (isobutyronitrile), with or without a solvent and allowing polymerization to proceed at a temperature of about 40° to 80° C. Polymerization is generally completed in 6 to 50 hours. At the end of the polymerization period, the reaction is stopped by pouring the mixture into a non-solvent such as isopropanol or hydrocarbons. The solid is then dried under vacuum at room temperature for about 16 hours. Although the yields and molecular weights of the polymers always depend on the polymerization conditions, such as the reaction time and temperature, it has been found that a molecular weight in the range of about 50,000–500,000 is particularly advantageous, with a preferred molecular weight in the range of about 130,000–150,000. The product obtained as above can be purified by dissolving it completely in a solvent such as chloroform, and then reprecipitated with a non-solvent such as hexanes.

A solution is prepared by mixing the polymer with a solvent. After the polymer dissolves completely, the solution is filtered, for example, through a 0.2 micron filter to remove any undesired particles. The polymer film is formed by pouring a drop of the filtered solution onto a substrate and spinning it at a speed of about 1500–6000 RPM. A suitable procedure is disclosed in U.S. Pat. No. 3,535,137 to Haller et al. To remove the residue of solvent remaining in the polymer, to relieve the strain building up in the polymer substrate, and to improve adhesion, the polymer film and substrate are baked at a temperature of 60° to 85° C. for 10 to 20 minutes. The coated substrate is then subjected to a predetermined electron beam exposure at the desired beam current, scanning speed, and density of the beam path.

The desired pattern is developed by removing the polymer from the unexposed area. This developing mechanism is based upon the fact that the exposed and unexposed polymers have different dissolution rates with respect to the developer used. For the negative active electron beam resist, the dissolution rate of the exposed area is always lower than that of the unexposed area. An optimum developer is one which gives the lowest dissolution rate ratio of exposed to unexposed polymers and also gives the minimum swelling and roughness of the exposed area.

Prior to the plasma etching, the developed, coated substrate is dried in an oven to remove the residue of the developer. This substrate is then placed in the plasma reactor and the portion of substrate which is not covered by polymer film is etched.

In a specific example of the present invention, a 2,000 milliliter 3-neck round bottom flask was equipped with a mechanical stirrer, a nitrogen inlet and a condenser which also serves as a nitrogen outlet. To this flask, a mixture 252 grams allyl methacrylate, 208 grams styrene, 1380 ml. toluene and 2.76 grams of azobis-(isobutyronitrile) was charged. This solution was then bubbled with nitrogen to expel oxygen. After five minutes of nitrogen purge, the whole system was immersed in a water bath 40° C. and the mechanical stirrer was turned on while a gentle nitrogen stream was passed over the solution. The polymerization proceeded for about 44 hours, and was stopped by pouring the solution into methanol to precipitate out the copolymer. The yield of the solid, which was dried under vacuum, was approximately 57.6 grams. The copolymer, having a molecular weight of about 80,000, was purified by dissolving it in 576 ml. chloroform followed by reprecipitation with 450 ml. of methanol. The solid was then dried at 23° C. under vacuum for 16 hours.

A solution of 15% copolymer solid in 2-methoxyethyl acetate was prepared and passed through a filter to remove any particles having a size larger than 0.2 microns. The polymer solution was then coated onto a silicon wafer and spun at approximately 2000 RPM to provide a polymer film with a thickness of about $6.9 \times 10^{-7}$ meters after baking at 70° C. for 15 minutes. To achieve different film thicknesses, the viscosity of the solution must be varied accordingly, with a lower viscosity resulting in a thinner film. The coated substrate was then subjected to a predetermined pattern of electron beam irradiation. The dosage of radiation which gives equal line and space widths of 1.25 microns at 60% thickness remaining was taken as the correct dosage. In this example the required dosage was found to be about $0.7 \times 10^{-6}$ coulombs/cm$^2$. After irradiation, the desired patterns in the exposed area were developed with a developer of n-butyl acetate and diisobutyl ketone in about a 1:1 ratio. The following mixtures at the indicated ratios were also found to be effective developers: methyl isoamyl ketone and n-butyl acetate, 3:4; butyl acetate and diisobutyl ketone, 2:1; 2-butoxyethyl acetate and 2-methoxy ethanol, 5:4; butyl acetate and methyl isobutyl ketone, 2:1.

In an imaging process employing the present invention, the copolymer film is formed as above on a silicon substrate having a 2250 Angstrom thermal oxide layer. After developing, the desired pattern is plasma etched to remove silicon dioxide which is not covered by the resist, using gaseous CF$_4$/C$_5$F$_{12}$ at 0.355 torr, 1000 watts at 40° C. After stripping the resist, a 1.25 micron feature is obtained with nearly vertical walls.

Thus, the present invention provides a negative, high sensitivity, high energy radiation resist resulting in mask patterns having nearly perpendicular walls and much narrower width openings than can be obtained with conventional resists.

Although specific examples of the invention have been described in detail it is to be understood that various changes, substitutions, additives and alterations can be made therein without departing from the spirit annd the scope of the invention as defined by the appended claims.

What is claimed is:

1. A method of forming a patterned, high resolution, high energy radiation negative resist, comprising the steps of:

forming a thin film of a copolymer formed of a first monomer having the structure

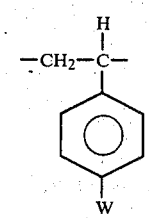

where
W is selected from the group consisting of H, F, Cl, Br, I, NO$_2$, CN and OCH$_3$, and a second monomer having the structure

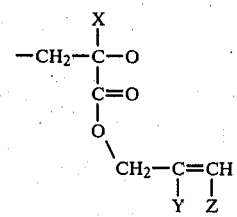

where
X is selected from the group consisting of H, CH$_3$, and Cl, and Y and Z are selected from the group consisting of H and CH$_3$;

selectively exposing said copolymer film to high energy radiation in a predetermined pattern until substantial cross-linking of said copolymer is effected in the exposed areas; and developing the resist image by exposing said copolymer film to a solvent which selectively removes only the unexposed areas while leaving the exposed copolymer film in the desired pattern.

2. The method of claim 1, wherein said developing solvent is a mixture selected from the group consisting of n-butyl acetate and diisobutyl ketone, methyl isoamyl ketone and n-butyl acetate, butyl acetate and diisobutyl ketone, 2-butoxyethyl acetate and 2-methoxy ethanol, and butyl acetate and methyl isobutyl ketone.

3. The method of claim 2, wherein said high energy radiation comprises an electron beam having an energy level of between about 10 KeV and 30 KeV.

4. A high-resolution, high energy radiation negative resist-forming composition comprising:
a copolymer formed of a first monomer having the structure

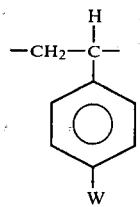

where

W is selected from the group consisting of H, F, Cl, Br, I, NO$_2$, CN and OCH$_3$, and a second monomer having the structure

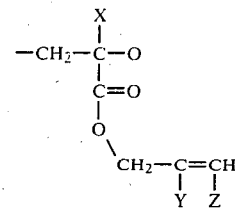

where
X is selected from the group consisting of H, CH$_3$ and Cl, and Y and Z are selected from the group consisting of H and CH$_3$.

5. The composition of claim 4, wherein said copolymer has an average molecular weight of between about 50,000 and 500,000.

6. The composition of claim 4, wherein said copolymer has an average molecular weight of between about 130,000 and 150,000.

7. The composition of claims 5 or 6 wherein the ratio of monomers is between about 4:1 and 1:4.

8. The composition of claim 4, wherein W=H, X=CH$_3$, Y=H, and Z=H, and wherein the ratio of said first and second monomers is substantially 1:1, said copolymer having a molecular weight of about 80,000.

* * * * *